(12) United States Patent
Sakakura et al.

(10) Patent No.: US 8,878,262 B2
(45) Date of Patent: Nov. 4, 2014

(54) SEMICONDUCTOR DEVICE AND MANUFACTURING METHOD OF THE SAME

(75) Inventors: Masayuki Sakakura, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/444,565

(22) Filed: Apr. 11, 2012

(65) Prior Publication Data
US 2012/0248448 A1 Oct. 4, 2012

Related U.S. Application Data

(63) Continuation of application No. 11/410,034, filed on Apr. 25, 2006, now Pat. No. 8,253,179.

(30) Foreign Application Priority Data

May 13, 2005 (JP) .................................. 2005-141132

(51) Int. Cl.
*H01L 31/062* (2012.01)
(52) U.S. Cl.
USPC .................. 257/291; 257/443; 257/E21.434; 257/E21.453; 438/149; 349/43; 349/52
(58) Field of Classification Search
USPC .................. 257/291, 443, E21.434, E21.453; 438/149; 349/52, 53
See application file for complete search history.

(56) References Cited

U.S. PATENT DOCUMENTS

| | | | |
|---|---|---|---|
| 6,225,697 B1 | 5/2001 | Iguchi | |
| 6,287,899 B1 | 9/2001 | Park et al. | |
| 6,373,544 B1 | 4/2002 | Hirabayashi | |
| 6,521,489 B2 | 2/2003 | Duthaler et al. | |

(Continued)

FOREIGN PATENT DOCUMENTS

| | | |
|---|---|---|
| CN | 1614485 A | 5/2005 |
| EP | 0 887 695 A2 | 12/1998 |

(Continued)

OTHER PUBLICATIONS

'Korean Office Action (Application No. 2006-0042560; KR08726) Dated May 7, 2012.

(Continued)

*Primary Examiner* — Su Kim
(74) *Attorney, Agent, or Firm* — Nixon Peabody LLP; Jeffrey L. Costellia

(57) ABSTRACT

An insulating film provided between adjacent pixels is referred to as a bank, a partition, a barrier, an embankment or the like, and is provided above a source wiring or a drain wiring for a thin film transistor, or a power supply line. In particular, at an intersection portion of these wirings provided in different layers, a larger step is formed there than in other portions. Even in a case that the insulating film provided between adjacent pixels is formed by a coating method, there is a problem that thin portions are partially formed due to this step and the withstand pressure is reduced. In the present invention, a dummy material is arranged near the large step portion, particularly, around the intersection portion of wirings, so as to alleviate unevenness formed thereover. The upper wring and the lower wiring are arranged in a misaligned manner so as not to align the end portions.

34 Claims, 12 Drawing Sheets

(56) References Cited

U.S. PATENT DOCUMENTS

| | | |
|---|---|---|
| 6,525,788 B1 | 2/2003 | Nakagawa et al. |
| 6,577,371 B2 | 6/2003 | Hirabayashi |
| 6,580,475 B2 | 6/2003 | Yamazaki et al. |
| 6,600,523 B2 | 7/2003 | Pang |
| 6,670,637 B2 | 12/2003 | Yamazaki et al. |
| 6,707,107 B2 * | 3/2004 | Kido .................. 257/354 |
| 6,739,931 B2 | 5/2004 | Yamazaki et al. |
| 6,784,949 B1 | 8/2004 | Nagata et al. |
| 6,861,368 B2 | 3/2005 | Chae |
| 6,943,496 B2 | 9/2005 | Hishida |
| 6,995,511 B2 | 2/2006 | Yamazaki et al. |
| 7,053,977 B2 | 5/2006 | Chang |
| 7,118,947 B2 | 10/2006 | Yoo et al. |
| 7,250,991 B2 | 7/2007 | Nagata et al. |
| 7,342,177 B2 | 3/2008 | Aoki |
| 2002/0047948 A1 * | 4/2002 | Yoo et al. .................. 349/43 |
| 2002/0070382 A1 | 6/2002 | Yamazaki et al. |
| 2002/0097367 A1 | 7/2002 | Hirabayashi |
| 2003/0151568 A1 | 8/2003 | Ozawa |
| 2003/0203643 A1 | 10/2003 | Hasei et al. |
| 2003/0222286 A1 | 12/2003 | Higuchi |
| 2004/0184131 A1 | 9/2004 | Kurashina |
| 2004/0195964 A1 | 10/2004 | Yamazaki et al. |
| 2005/0007015 A1 | 1/2005 | Yokoyama et al. |
| 2005/0092995 A1 * | 5/2005 | Yoo et al. .................. 257/72 |
| 2005/0224805 A1 | 10/2005 | Hishida |
| 2006/0124933 A1 | 6/2006 | Kang |
| 2006/0131678 A1 | 6/2006 | Yajima et al. |
| 2006/0231858 A1 | 10/2006 | Akimoto et al. |
| 2007/0024793 A1 | 2/2007 | Yoo et al. |

FOREIGN PATENT DOCUMENTS

| | | |
|---|---|---|
| EP | 1 037 095 A2 | 9/2000 |
| EP | 2 192 441 A2 | 6/2010 |
| JP | 62-104052 A | 5/1987 |
| JP | 03-163828 A | 7/1991 |
| JP | 03-196631 A | 8/1991 |
| JP | 04-107950 A | 4/1992 |
| JP | 04-299895 A | 10/1992 |
| JP | 05-053135 A | 3/1993 |
| JP | 05-346590 | 12/1993 |
| JP | 09-148444 A | 6/1997 |
| JP | 10-186399 A | 7/1998 |
| JP | 10-333187 | 12/1998 |
| JP | 11-133457 | 5/1999 |
| JP | 2000-122097 | 4/2000 |
| JP | 2000-323698 | 11/2000 |
| JP | 2001-125137 | 5/2001 |
| JP | 2002-164181 | 6/2002 |
| JP | 2003-008026 A | 1/2003 |
| JP | 2003-338368 | 11/2003 |
| JP | 2004-260133 | 9/2004 |
| JP | 2004-363300 A | 12/2004 |
| JP | 2005-340011 | 12/2005 |
| KR | 1999-0007017 | 1/1999 |

OTHER PUBLICATIONS

'Korean Office Action (Application No. 2011-0043783; KR08726D1) Dated May 4, 2012.

'Korean Office Action (Application No. 2006-0042560; KR08726) Dated Feb. 16, 2012.

Chinese First Office Action issued Sep. 5, 2008 for Chinese Patent Application No. 200610082690.5 filed May 12, 2006, along with English language translation, pp. 1-6.

* cited by examiner

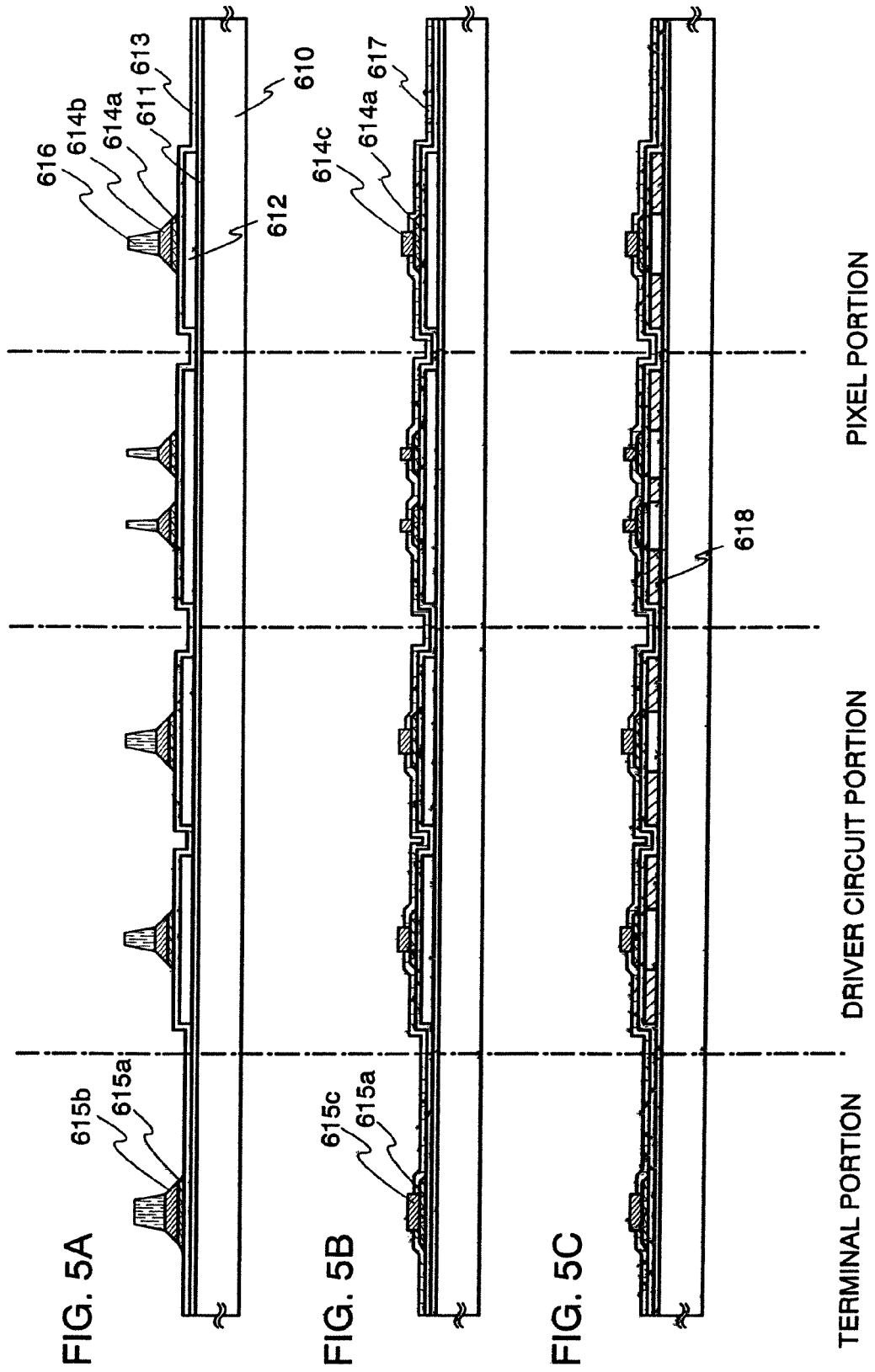

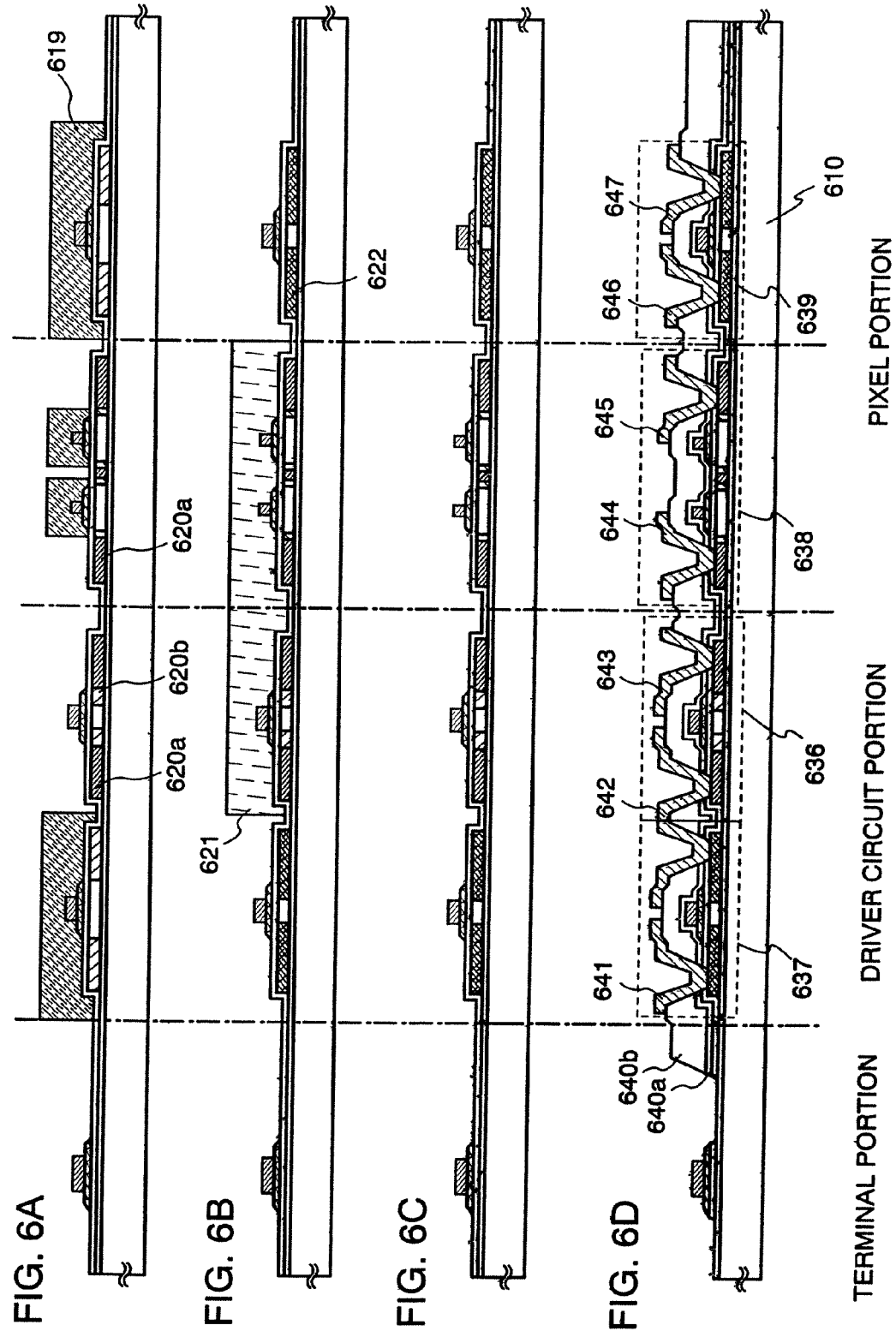

SEMICONDUCTOR DEVICE AND MANUFACTURING METHOD OF THE SAME

BACKGROUND OF THE INVENTION

1. Field of the Invention

The present invention relates to a semiconductor device having a circuit including a thin film transistor (also referred to as a TFT) and a manufacturing method thereof. For example, the present invention relates to electronic devices having, as a part, an electro-optic device typified by a liquid crystal display panel or a light-emitting display device having an organic light-emitting element or an inorganic light-emitting element.

Note that a semiconductor device in this specification means a generic device which can operate with use of semiconductive characteristics and includes all types of devices such as an electro-optic device, a semiconductor circuit and an electronic device.

2. Description of the Related Art

In recent years, a technology for forming a thin film transistor (TFT) using a semiconductor thin film (a thickness of around several nanometers to several hundred nanometers) formed over a substrate having an insulating surface has been attracting attention. Thin film transistors are broadly applied to electronic devices such as an IC or an electro-optic device, and are particularly developed as switching elements for image display devices at a rapid rate.

Light emitting elements, which use organic compounds as a light emitter and are characterized by their thinness, lightweight, fast response, and direct current low voltage drive, are expected to be applied to next-generation flat panel displays. Among display devices, ones having light emitting elements arranged in matrix have a wide viewing angle and excellent visibility.

In a light-emitting display device in which thin film transistors are arranged in matrix over a substrate having an insulating surface, convex or concave portions are formed due to a wiring or an electrode in the surface of the substrate. When an insulating film is formed thereover by a coating method, it is difficult to have an even thickness. In addition, a film thickness over the convex portion becomes thin, by a centrifugal force in forming a film by a coating method. There is a problem in that resistance to pressure is reduced in the convex portion whose film thickness of the insulating film is thin.

When the film thickness is made thicker to increase the resistance to pressure of the insulating film simply, the stress of the whole insulating film is increased. Thus, there is a risk of peeling of the insulating film or a warpage of a substrate.

In addition, a light-emitting display device in which thin film transistors are arranged in matrix has a structure described in Reference 1, specifically a structure in which an insulating film is provided between adjacent pixels (Reference 1: Japanese Patent Application Laid-Open No. 2002-164181).

The insulating film provided between adjacent pixels is referred to as a bank, a partition, a barrier, an embankment or the like, and is provided over a source wiring or a drain wiring for a thin film transistor, or a power supply line. Specifically, at an intersection portion of these wirings provided in different layers, a larger step is formed there than in other portions.

Even in the case that the insulating film provided between adjacent pixels is formed by a coating method, there is a problem in that thin portions are partially formed due to this step and the resistance to pressure is reduced.

SUMMARY OF THE INVENTION

The present invention has been made in view of the above mentioned problems. It is an object of the present invention to realize a highly reliable light-emitting device having a highly insulating property or a highly resistance to pressure.

In the present invention, a dummy material is arranged near the large step portion, particularly, around the intersection portion of wirings, so as to alleviate the unevenness (convex and concave portion) of the insulating film formed thereover.

There is a tendency to produce a partial thin portion when an end portion of an upper wiring and an end portion of a lower wiring are aligned. Thus, one feature of the present invention is to arrange the upper wring and the lower wiring in a misaligned manner so as not to align the end portions. Further, one feature of the present invention is to arrange the upper wiring and the lower wiring such that a line width of the upper wiring is broader than a line width of the lower portion, so as not to align the end portions of the upper wiring and the lower wiring.

In particular, when the upper wiring and the lower wiring are arranged in parallel, seen from the top, it is preferable that a side face of the upper wiring and a side face of the lower wiring are not aligned.

In addition, in forming the lower wiring, the lower wiring is preferably formed to have a tapered shape in the cross section and etching is preferably conducted to make the wiring width thinner. In other words, the lower wiring is formed to have a cross section having a tapered shape and the etching is conducted to make the wiring width thinner. Then, even when the end portions of the upper wiring and the lower wiring are aligned in the design of mask, the upper wiring and the lower wiring can be formed so as not to align the end portions thereof in forming the lower wiring and the upper wiring actually.

In the coating (at a normal temperature), a solution for an insulating material whose viscosity is from 10 cp (centipoises) to 60 cp (centipoises) is applied, and dried to obtain an insulating film having an even thickness even at the step portion.

By the present invention, an insulating property and resistance to pressure between two wiring layers (upper wiring and lower wiring) sandwiching an insulating film can be improved drastically.

The above described means are not merely matters of design, but they are matters invented by the present inventors which have manufactured a light-emitting device, displayed an image by the device and made an ample study thereof.

A structure of the present invention is a semiconductor device comprising: a first wiring, a second wiring and a metal layer over an insulating surface; a first insulating layer covering the first wiring, the second wiring and the metal layer; an electrode over the first insulating layer, wherein the electrode is in contact with the second wiring; and a second insulating layer covering the electrode, the first insulating layer, the first wiring, the second wiring and the metal layer, wherein the first wiring, the second wiring and the metal layer are made of the same material, and wherein the electrode is provided between the metal layer and the first wiring.

Further, a structure of the present invention is a semiconductor device comprising: a first wiring and a second wiring over an insulating surface; a first insulating layer covering the first wiring and the second wiring; a first electrode, a second electrode and a metal layer over the first insulating layer, wherein the metal layer is in an electrically floating state; a second insulating layer covering the first insulating layer, the first electrode, the metal layer, the first wiring and the second wiring; a light-emitting layer over the second electrode; a third electrode over the light-emitting layer, wherein the second wiring has a same material as the first wiring, and the metal layer is made of the same material as the first electrode, and wherein the first electrode is provided between the metal layer and the first wiring.

One feature of the above structure is that a portion in which the second electrode, the third electrode and the light-emitting layer are overlapped, constitutes a light-emitting element.

A light-emitting element includes a layer including an organic compound (hereinafter, an EL layer) exhibiting electroluminescence by being applied with electric field, an anode and a cathode. Luminescence from an organic compound includes luminescence generated in returning to a ground state from a singlet excited state (fluorescence) and luminescence generated in returning to a ground state from a triplet excited state (phosphorescence). The present invention can be applied to cases of using either luminescence.

One feature of the above structure is that the second insulating layer is a partition covering a vicinity portion of the second electrode.

One feature of the above structure is that the metal layer is an electrode which is electrically floating.

Further, one feature of the above structure is that the semiconductor device has a first thin film transistor having the first wiring as a gate electrode, and a second thin film transistor having the second wiring as a gate electrode.

Further, an amorphous semiconductor film, a semiconductor film including a crystalline structure, a compound semiconductor film including an amorphous structure, or the like can be appropriately used as a channel forming region of a thin film transistor (also referred to as a TFT). Furthermore, a semi-amorphous semiconductor film (also referred to as a microcrystalline semiconductor film) can also be used as a channel forming region of the TFT. The semi-amorphous semiconductor film has an intermediate structure between an amorphous structure and a crystal structure (also including a single crystal structure and a polycrystal structure), and a third condition that is stable in term of free energy, and includes a crystalline region having a short-range order with lattice distortion.

In addition, one feature of the above structure is that the second insulating layer contains a solvent and is formed by applying a solution for a material whose viscosity is 10 cp or more and 60 cp or less by a coating method.

In a semiconductor device of the present invention, a protection circuit (such as a protection diode) may be provided for prevention of damages by electro-static discharge.

Moreover, in the semiconductor device of the present invention, in a case of a light-emitting device in which light-emitting elements are arranged in matrix, a method for driving a screen display of the light-emitting device is not limited particularly, and a dot-sequential driving method, a line-sequential driving method, a frame sequential driving method or the like may be used, for example. The line-sequential driving method is typically employed, and a time division gray scale driving method or an area gray scale driving method may be employed appropriately. In addition, a video signal to be inputted into a source line of the light-emitting device may be an analog signal or a digital signal, and a driver circuit and the like may be designed appropriately according to the video signal.

Further, light-emitting devices using digital video signals are classified into ones in which video signals are inputted into a pixel at a constant voltage (CV), and ones in which video signals are inputted into a pixel at a constant current (CC). The light-emitting devices in which video signals are inputted into a pixel at a constant voltage (CV) are further classified into ones in which a signal is inputted to a light-emitting element at a constant voltage (CVCV), and ones in which a signal is inputted to a light-emitting element at a constant current (CVCC). The light-emitting devices in which video signals are inputted into a pixel at a constant current (CC) are classified into ones in which a constant voltage is applied to a light-emitting element as a signal (CCCV), and ones in which a constant current is applied to a light-emitting element as a signal (CCCC).

By the present invention, in a case that an insulating film formed by a coating method is used between films, a short circuit between wirings provided in different layers is effectively prevented. Therefore, the yield in a manufacturing process of a semiconductor device can be improved. Moreover, the reliability of the manufactured semiconductor devices can also be increased.

BRIEF DESCRIPTION OF DRAWINGS

FIGS. 5A to 5C show manufacturing steps of a light-emitting device (Embodiment Mode 4);

FIGS. 6A to 6D show manufacturing steps of a light-emitting device (Embodiment Mode 4);

DETAILED DESCRIPTION OF THE INVENTION

Embodiment Modes of the present invention are described hereinafter. The present invention is not limited to the following description, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Embodiment Mode 1

Figure 1A:
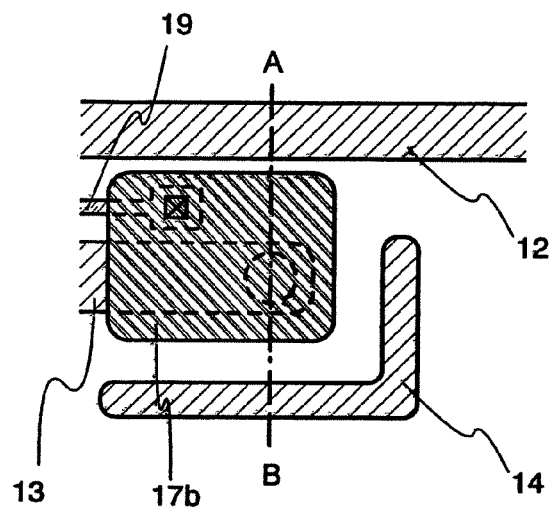
FIGS. 1A and 1B are a top view and a cross sectional view showing a part of a pixel of a light-emitting device (Embodiment Mode 1)
Figure 1B:
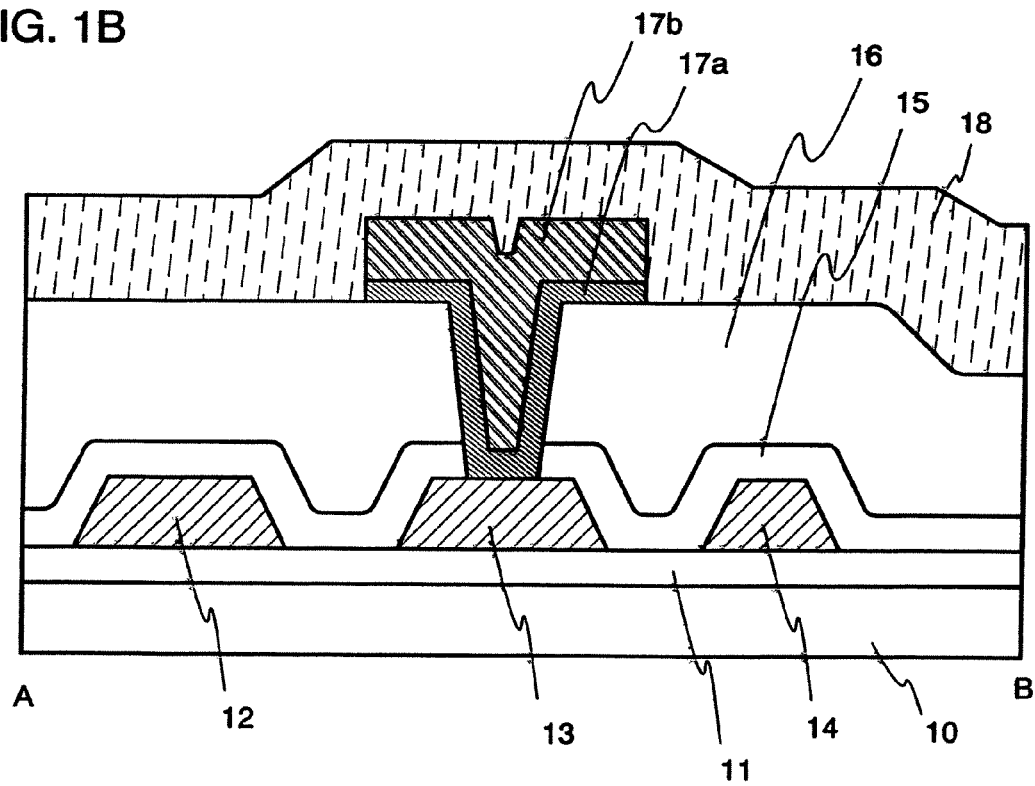

Embodiment Mode 1 describes an example in which by providing a dummy material, a partial thin portion of an insulating film to be formed over the dummy material is prevented from occurring, with reference to FIGS. 1A and 1B.

FIG. 1A is a top view showing a portion of a pixel of a light-emitting device, and FIG. 1B is a cross sectional view taken along a chain line A-B.

Steps for obtaining the structures shown in FIGS. 1A and 1B are described.

A first insulating layer 11 is formed over a glass substrate 10 having an insulating surface, and a first wiring 12, a second wiring 13 and a metal layer 14 are formed thereover. The metal layer 14 may be a conductive layer as well. The metal layer 14 serves as a dummy material, and can be an electrode which is in an electrically floating state, i.e., a floating electrode. In addition, the first insulating layer also serves as a gate insulating film of a thin film transistor. A gate electrode of the thin film transistor is formed in the same step as the first wiring 12, the second wiring 13 and the metal layer 14.

A second insulating layer 15 and a third insulating layer 16 are stacked to cover these wirings and the metal layer.

The second insulating layer 15 and the third insulating layer 16 are selectively etched using a mask to form a contact hole to reach the second wiring 13.

Then, a first electrode formed of a metal material is formed. Here, the first electrode has a structure in which a titanium layer 17a and an aluminum layer 17b are stacked. In addition, a source electrode or a drain electrode of the thin film transistor is formed in the same step as the first electrode.

A second electrode is formed over the third insulating layer 16. The second electrode is electrically connected to the source electrode or the drain electrode of the thin film transistor.

Then, a fourth insulating layer 18 is formed by a coating method using an insulating material including a solvent. At this stage, the states shown in FIGS. 1A and 1B can be obtained.

Figure 12A:
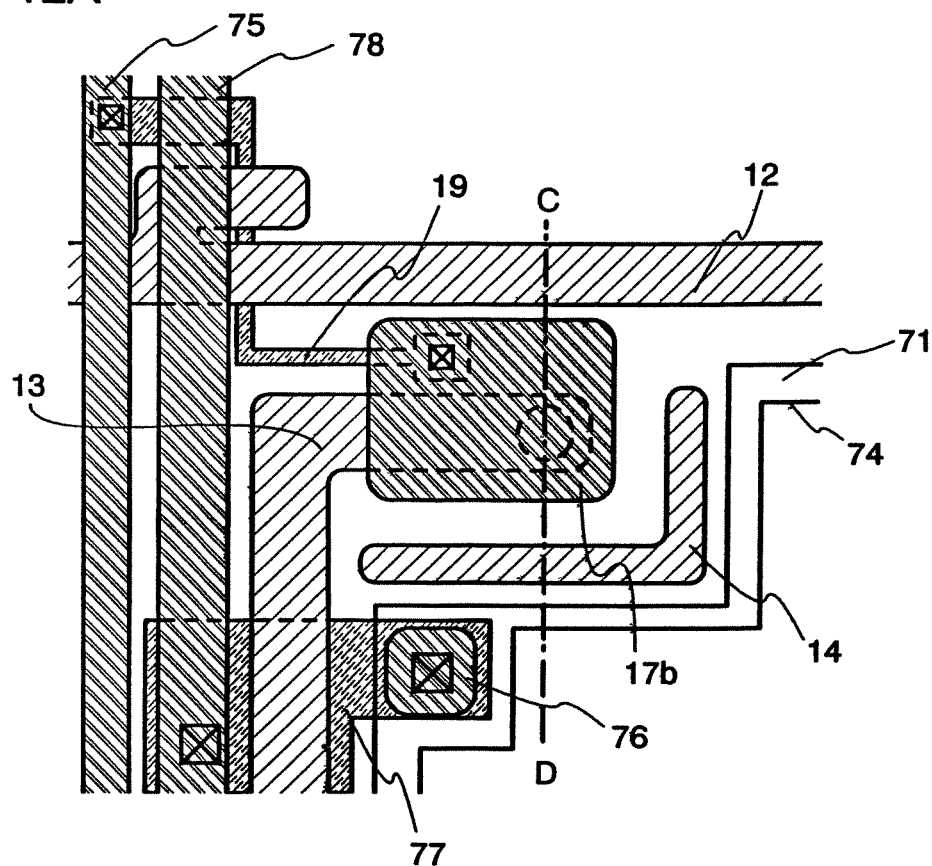
FIGS. 12A and 12B are a top view and a cross sectional view showing a part of a pixel of a light-emitting device (Embodiment Mode 1).
Figure 12B:
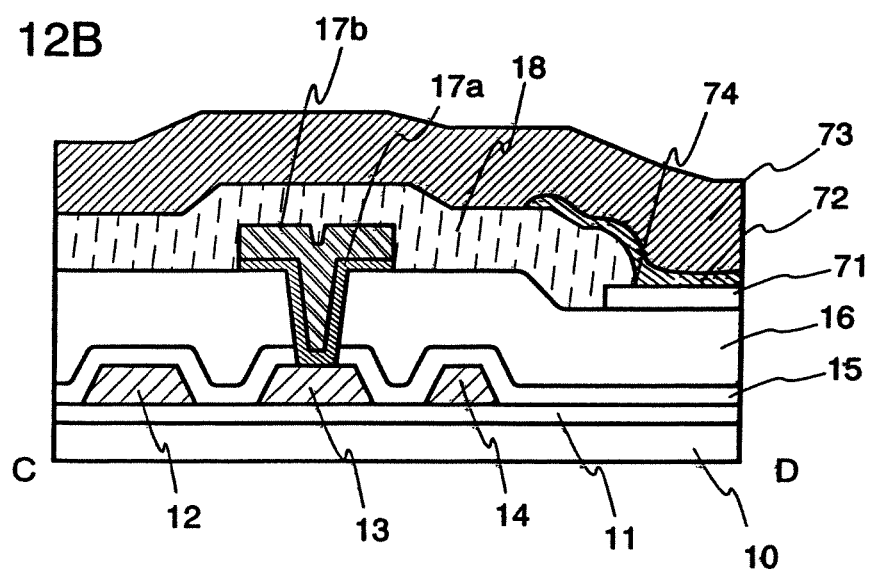

It is noted that FIG. 1B shows a light-emitting device which is not yet completed. A light-emitting layer including at least one of an organic compound and an inorganic compound 72, and a third electrode 73 are stacked over the fourth insulating layer 18. A cross sectional view after forming the third electrode 73 is shown in FIG. 12B. The light-emitting element includes the second electrode 71, the light-emitting layer including at least one of an organic compound and an inorganic compound 72, and the third electrode 73. In particular, there is a risk that a short circuit may occur between an upper end portion of the aluminum layer 17b and the third electrode 73. In this embodiment mode, by forming the metal layer 14 serving as a dummy material, the fourth insulating film 18 is prevented from being partially thinned. Further, FIG. 12A is a top view showing the pixel area more widely than FIG. 1A. A source wiring 75 is electrically connected to a thin film transistor having the first semiconductor layer 19 as an active layer. The first semiconductor layer 19 is electrically connected to the first electrode through a contact hole, and the first electrode is electrically connected to the second wiring 13 through a contact hole. Further, the second wiring 13 serves as a gate electrode which overlaps the second semiconductor layer 77 through the second insulating layer 15. The second semiconductor layer 77 is electrically connected to a power supply line 78 and a connection electrode 76, and the connection electrode 76 is electrically connected to the second electrode 71. Meanwhile, the connection electrode 76, the source wiring 75 and the power supply line 78 are made of the same material as the first electrode. The fourth insulating film 18 serves as a partition covering an end portion of the second electrode 71, and a vicinity of the fourth insulating layer 18 is shown by a reference numeral 74 in FIG. 12A. As shown in FIG. 12A, the present invention prevents a film thickness of the fourth insulating layer 18 from being partially thinned by providing the metal layer 14 between the first electrode which overlaps the second wiring 13 and the vicinity 74 of the fourth insulating film 18.

In addition, the first wiring 12 also has a function of alleviating convex and concave portions of the fourth insulating layer 18. In Embodiment Mode 1, by placing the first wiring 12 and the metal layer 14 at a certain interval so as to surround the first electrode, the unevenness of the fourth insulating layer 18 is alleviated.

The top shape of the metal layer 14 adopts an L-like shape; however, there is no particular limitation on the shape, and plural rectangle shapes may be used.

Embodiment Mode 2

Figure 2A:
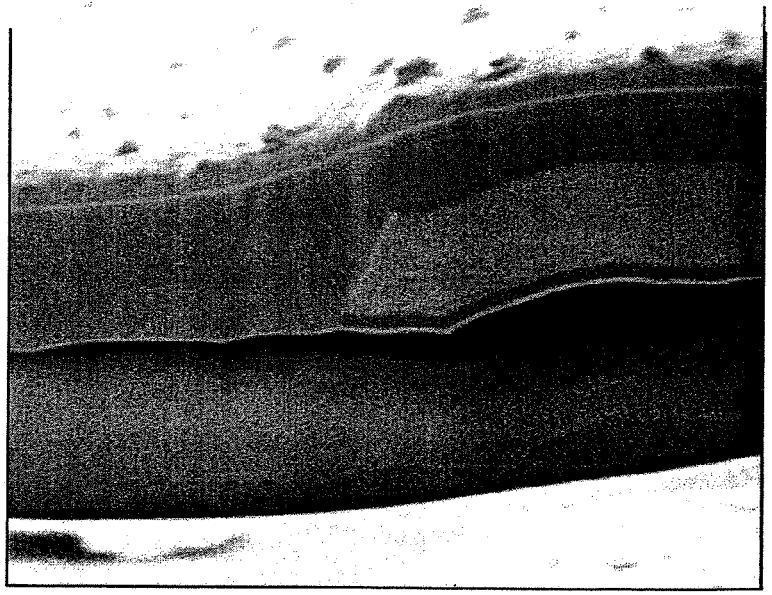
FIGS. 2A and 2B are a photograph and a schematic view showing a cross section around a wiring (Embodiment Mode 2)
Figure 2B:
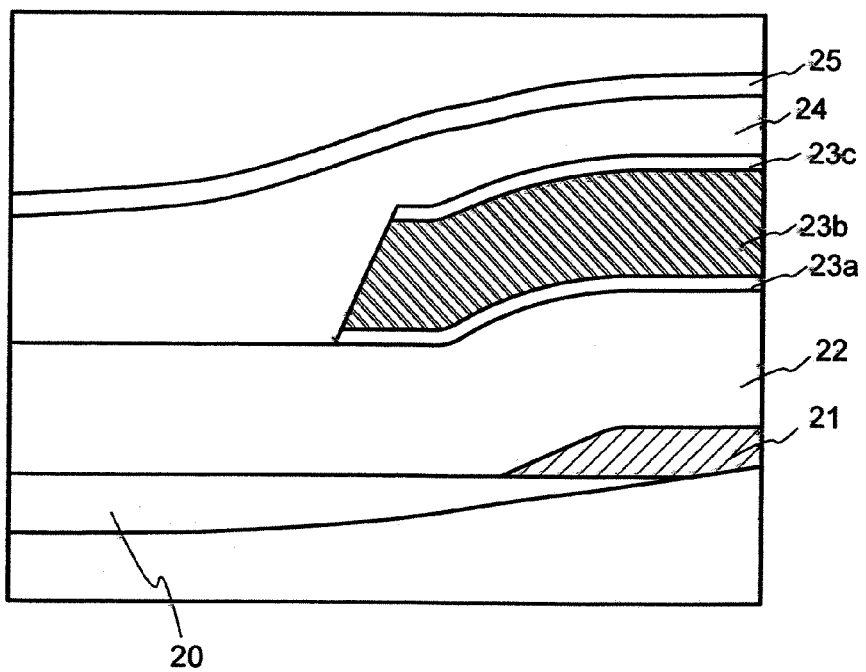
Figure 3:
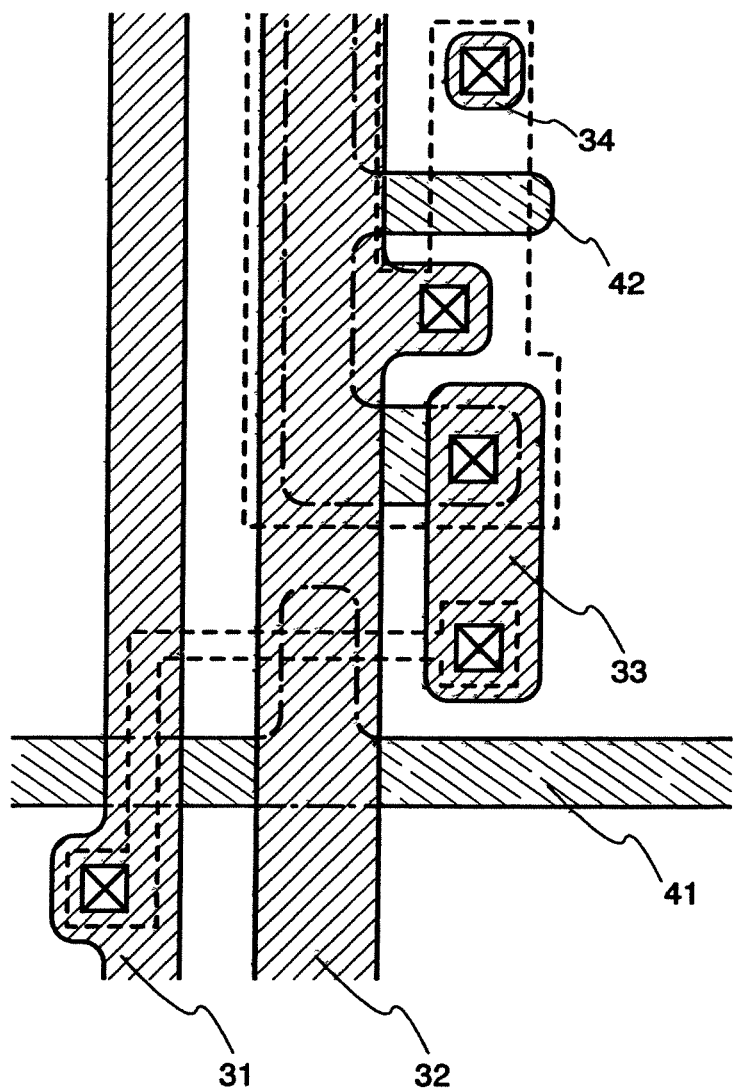
FIG. 3 is a top view showing a layout of a pixel as one example (Embodiment Mode 2)

Embodiment Mode 2 describes an example in which an end portion of an upper wiring and an end portion of a lower wiring are not aligned, with reference to FIGS. 2A, 2B and 3.

Actually, a light-emitting device is formed to have a layout in which the positions of the end portion of the upper wiring and the end portion of the lower wiring are different, and a photograph of a cross section showing a part thereof is shown in FIG. 2A. A schematic view corresponding to FIG. 2A is shown in FIG. 2B.

In FIG. 2B, a gate metal layer 21, a first insulating layer 22, a first titanium film 23a, an aluminum film 23b, a second titanium film 23c, and a second insulating layer 24 are provided over a glass substrate 20. A layer including an organic compound and an upper electrode 25 which constitute parts of a light-emitting element are formed over the second insulating layer 24. It is noted that a lower electrode of the light-emitting element is not shown in FIG. 2B.

Figure 11A:
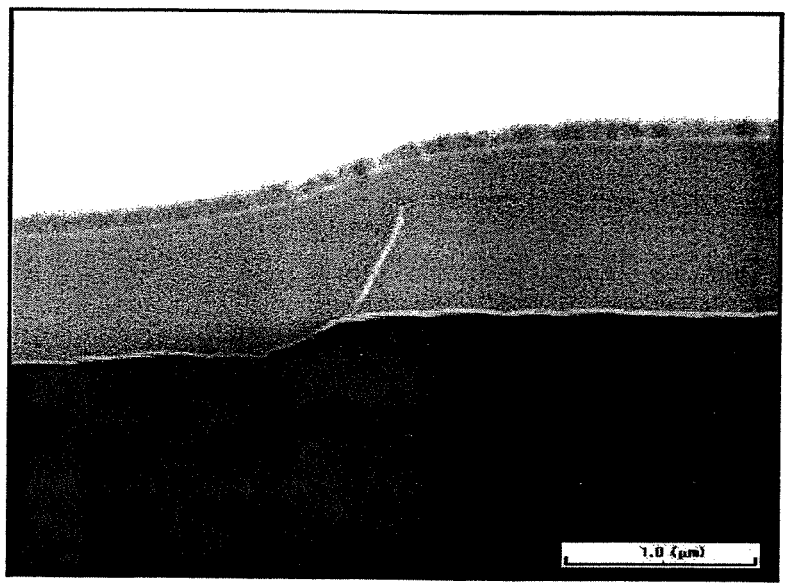
FIGS. 11A and 11B show a comparative example.
Figure 11B:
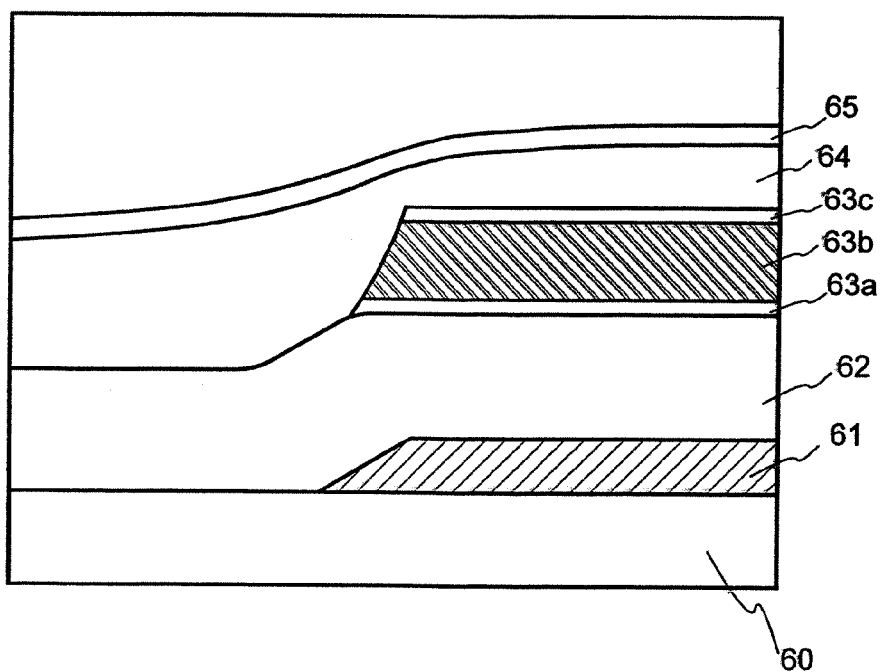

In addition, as a comparative example, a light-emitting element is formed to have a layout in which an end portion of the upper wiring and an end portion of the lower wiring are aligned, and a cross section of a part thereof is shown in FIG. 11A. FIG. 11B is a schematic view corresponding to FIG. 11A. In FIG. 11B, a gate metal layer 61, a first insulating layer 62, a first titanium layer 63a, an aluminum film 63b, a second titanium film 63c, and a second insulating layer 64 are provided over a glass substrate 60. A layer including an organic compound and an upper electrode 65 which form a light-emitting element is formed over the second insulating layer 64. In FIG. 11B, a lower electrode of the light-emitting element is not shown. As shown in FIG. 11A, when the end portion of the upper wiring (63a to 63c) and the end portion of the lower wiring (a gate metal layer 61) are aligned, the thickness of the second wiring layer 64 becomes small in the upper end portion of the upper wiring. The smallest thickness is about 0.1 µm. The thickness of the second wiring layer 64 in the region in which the upper wiring is not formed, is about 1 µm. Accordingly, the thickness of the second wiring layer 64 is different in parts, and the largest thickness is ten times as much as the smallest thickness.

On the other hand, as shown in FIG. 2A, in the case that the positions of the end portion of the upper wiring (23a to 23c) and the end portion of the lower wiring (a gate metal layer 21) are different from each other, the distance between the upper end portion of the upper wiring and the upper electrode 25 can be increased. The thickness of the second insulating layer 24 in the region in which the upper wiring layer is not formed is equal to that of the second insulating layer 64, about 1 µm; however, the smallest thickness of the second insulating layer 24 can be about 0.2 µm or more.

In addition, an example of a layout of a pixel is shown in FIG. 3.

In FIG. 3, over an insulating surface, a semiconductor layer (the region surrounded by a dotted line in FIG. 3) is formed, a gate insulating film is formed thereover, and first wirings 41 and 42 are formed thereover at the same time. One interlayer insulating film or two insulating films are formed over the first wiring layer, and second wirings 31 and 32 and electrodes 33 and 34 are formed over the interlayer insulating film at the same time. It is noted that the electrode 33 is a connection electrode for connecting two TFTs. The electrode 34 is connected to one electrode of a cathode and an anode of the light-emitting element.

In FIG. 3, intersection portions of the two wirings, i.e., overlapping portions, are seen. The wirings are arranged such that the end portions of the wirings, i.e., side faces of the wirings are not aligned with each other. Specifically, as compared with the second wiring 32, the wiring widths of the first wiring layers 41 and 42 are smaller, and the wirings are arranged such that the side face of the second wiring 32 and the side face of the first wiring 41 are not aligned, and such that the side face of the second wiring 32 and the side face of the first wiring 42 are not aligned.

By adopting the layout of the wirings shown in FIG. 3, when an insulating film is formed over these wirings by a coating method, it is possible to prevent the insulating film from being partially thinned. Therefore, an insulator (a partition provided between adjacent light-emitting elements) which is obtained by patterning the insulating film can prevent a short circuit between electrodes.

In addition, this embodiment mode can be freely combined with Embodiment Mode 1.

Embodiment Mode 3

Figure 4A:
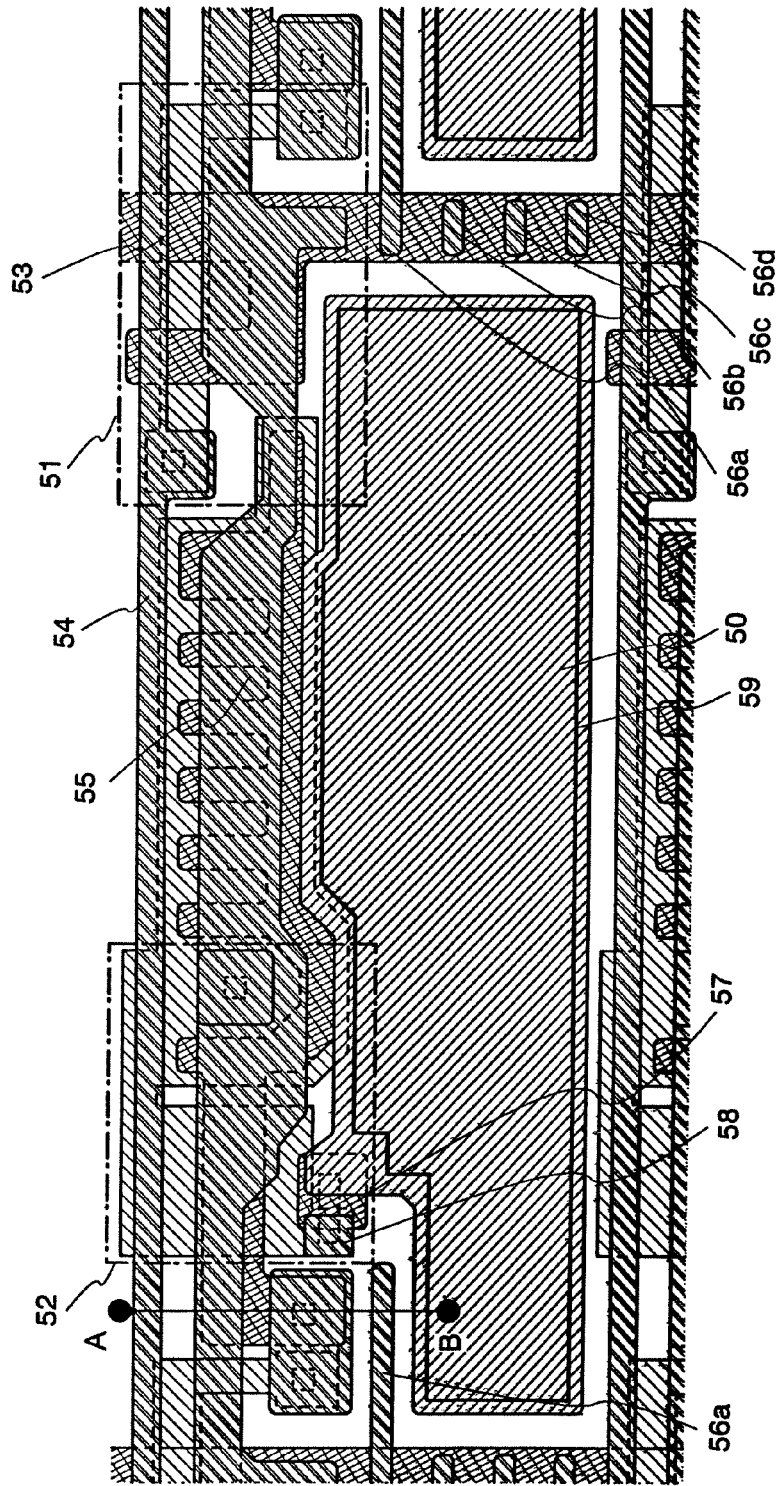
FIGS. 4A and 4B are a top view and a cross sectional view showing a layout of a pixel as one example (Embodiment Mode 3)
Figure 4B:
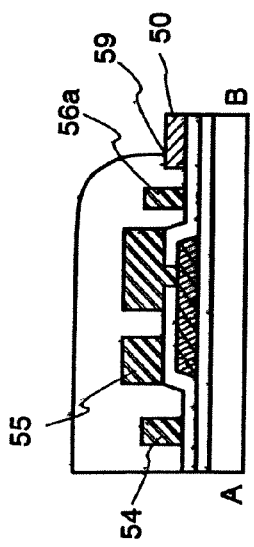

Embodiment Mode 3 describes a pixel structure in which Embodiment Mode 1 and Embodiment Mode 2 are combined with reference to FIGS. 4A and 4B.

A top view of one pixel included in a pixel region of a display device is shown in FIG. 4A. In FIG. 4A, the pixel includes a thin film transistor 51, a thin film transistor 52, a first electrode layer 50, a gate wiring layer 53, a source or drain wiring layer 54, a power supply line 55, and conductive layers 56a, 56b, 56c and 56d. A source or drain electrode layer 58 of the thin film transistor 52 is electrically connected to the first electrode 50 through a conductive layer 57. The conductive layer 57 is formed using the same material and in the same step as the gate wiring layer 53.

The conductive layers 56a, 56b, 56c and 56d are formed using the same material and in the same step as the source or drain wiring layer 54, and the power supply line 55, and are provided to alleviate a drastic change of the film thickness caused by stacking of the wirings. The conductive layers 56a, 56b, 56c and 56d are electrically insulated from other wirings. In the region in which the gate wiring layer 53 intersects with the source or drain wiring layer 54 or the power supply line 55, wiring layers are stacked, and thus, the film thickness is increased drastically. However, by placing conductive layers 56a, 56b, 56c and 56d around the intersection portion, the coverage of the insulating layer serving as a partition formed thereover is increased, and thus, formation defects caused by unevenness of the film thickness can be prevented. Part of the conductive layer 56a overlaps the gate wiring layer 53. In order to prevent an increase of a parasitic capacitance, the conductive layers 56b, 56c and 56d overlap the gate wiring layer 53 having intervals with each other. Further, an insulating film serving as a partition is formed so as to cover an end portion of the first electrode layer 50, and a vicinity of the insulating film serving as the partition is shown by a reference numeral 59 in FIG. 4A. FIG. 4B shows a cross sectional view taken along a line A-B in FIG. 4A. As shown in FIG. 4B, the conductive layer 56a is provided between the vicinity 59 of the insulating film serving as the partition and a gate electrode of the thin film transistor 51 or 52.

In addition, by arranging the wirings such that a side face of the conductive layer formed using the same material in the same step is not aligned with a side face of the gate wiring layer, it is possible to prevent the thickness of the insulating film serving as a partition from being partially thinned.

Therefore, productivity is increased and a display device having a high reliability can be manufactured with a favorable yield.

Embodiment Mode 4

Embodiment Mode 4 describes a manufacturing method of an active matrix light-emitting device with reference to FIGS. 5A to 5C, 6A to 6D and 7.

A base insulating film 611 is formed over a substrate 610. When light is extracted on the substrate 610 side to display an image, a light-emitting glass substrate or quartz substrate may be used as the substrate 610. In addition, a light-transmitting plastic substrate which can withstand a processing temperature may be used. In addition, when light is extracted on a side opposite to the substrate 610 side to display an image, a silicon substrate, a metal substrate or a stainless steel substrate whose surfaces are each provided with an insulating film may be used, besides the above described substrates. Here, a glass substrate is used as the substrate 610. It is noted that a refractive index of the glass substrate is around 1.55.

As the base insulating film 611, a base film formed of an insulating film such as a silicon oxide film, a silicon nitride film or a silicon oxynitride film is formed. Here, an example of using a single layer structure for the base film is shown; however, a structure in which two or more insulating film mentioned above are stacked may be employed. In addition, if unevenness of the substrate or diffusion of an impurity from the substrate does not cause a problem, it is not essential to form a base insulating film.

Thereafter, a semiconductor layer 612 is formed over the base insulating film. The semiconductor layer 612 is formed by the following method: a semiconductor film with an amorphous structure is formed by a known method (such as a sputtering method, an LPCVD method, or a plasma CVD method), and is crystallized by a known crystallization method (such as a laser crystallization method, a thermal crystallization method or a thermal crystallization method using a catalyst such as nickel) to obtain a crystalline semiconductor film. The crystalline semiconductor film is patterned into a desired shape using a first photomask to obtain the semiconductor layer 612. It should be noted that if a plasma CVD method is used, the base insulating film and the semiconductor film with an amorphous structure can be sequentially stacked without being exposed to air. The semiconductor film is formed to have a thickness of 25 to 80 nm (preferably 30 to 70 nm thick). There is no particular limitation on the material of the crystalline semiconductor film; however, preferably, silicon, silicon germanium (SiGe) alloy or the like may be used.

In addition, a continuous wave laser may be used for crystallization treatment of the semiconductor film with an amorphous structure. When crystallizing the amorphous semiconductor film, it is preferable that second to fourth harmonics of a fundamental wave be applied by using a solid laser which can oscillate continuously to obtain a crystal with a large grain diameter. Typically, a second harmonic (532 nm) or a third harmonic (355 nm) of an Nd:YVO$_4$ laser (a fundamental wave, 1064 nm) may be applied. When a continuous wave laser is used, laser light emitted from a continuous wave YVO$_4$ laser of output of 10 W is converted to harmonic by a nonlinear optical element. There is also a method for emitting a harmonic by putting a YVO$_4$ crystal and a nonlinear optical element in a resonator. Then, the harmonic is preferably formed so as to have a rectangular or elliptical shape on an irradiated surface by an optical system and emitted onto an object to be processed. At this time, an energy density of about 0.01 to 100 MW/cm$^2$ (preferably 0.1 MW/cm$^2$ to 10 MW/cm$^2$) is required. The semiconductor film may be irradiated by being moved relatively to the laser light at speeds of about 10 to 2000 cm/s.

Thereafter, a resist mask is removed. Then, if necessary, a slight amount of an impurity element (boron or phosphorus) is added into the semiconductor film to control a threshold value of the TFT. Here, an ion doping method in which diborane (B$_2$H$_6$) is plasma-excited without mass separation is used.

Then, an oxide film is removed from the surface of the semiconductor layer by an etchant including hydrofluoric acid, and at the same time, the surface of the semiconductor layer is washed.

Then, an insulating film 613 is formed to cover the semiconductor layer. The insulating film 613 is formed to have a thickness of 1 to 200 nm by a plasma CVD method or a sputtering method. Preferably, after a single layer or a stacked layer of an insulating film including silicon is formed to have a thin thickness of 10 to 50 nm, a surface nitriding treatment using plasma generated with a microwave is conducted. The insulating film 613 serves as a gate insulating film of a TFT to be formed later.

Next, a first conductive film with a thickness of 20 to 100 nm and a second conductive film with a thickness of 100 to 400 nm are stacked over the insulating film 613. In this embodiment mode, a tantalum nitride film with a thickness of 50 nm and a tungsten film with a thickness of 370 nm are sequentially stacked over the insulating film 613, and patterned to form each gate electrode and each wiring by a method shown below.

Here, TaN film and W film are stacked as a conductive film; however, there is no particular limitation. A single layer or a stacked layer of an element selected from Ta, W, Ti, Mo, Al, or Cu or an alloy material or a compound material mainly including such elements may be used. A semiconductor film typified by a polycrystalline silicon film doped with an impurity element such as phosphorus, may also be used. In addition, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially stacked.

An ICP (inductively coupled plasma) etching method may be used for etching the first conductive film and the second conductive film (a first etching treatment and a second etching treatment). The ICP etching method is used, and the etching conditions (the amount of an electric energy applied to a coiled electrode, the amount of an electric energy applied to an electrode on a substrate side, a temperature of the electrode on the substrate side, and so on) are appropriately adjusted, so that a film can be etched to have a desired tapered shape.

The first etching treatment is conducted after a mask made of resist is formed. The first etching conditions include applying an RF (13.56 MHz) power of 700 W to a coiled electrode at a pressure of 1 Pa, employing CF$_4$, Cl$_2$, and O$_2$ for an etching gas, and setting the gas flow rate ratio thereof to 25:25:10 (sccm). The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc which is 25 cm in diameter (here, a quartz disc provided with a coil). The W film is etched under these first etching conditions to make the end portion tapered. Thereafter, the first etching conditions are switched to the second etching conditions without removing the resist mask 616. The second etching conditions include using CF$_4$ and Cl$_2$ for an etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of CF$_4$ and Cl$_2$ is used, the W film and the TaN film are etched to almost the same degree. The first etching conditions and the second etching conditions constitute the first etching treatment.

FIG. 5A shows a cross section when the first etching treatment is finished. At this stage, a gate electrode and a wiring are formed, in which the first conductive layer 614*a* is a lower layer and the second conductive layer 614*b* is a lower layer. A terminal electrode in which the first conductive layer 615*a* is a lower layer and the second conductive layer 615*b* is an upper layer, is formed.

Next, the second etching treatment is conducted with the resist mask 616 kept in place. The third etching conditions include using CF$_4$ and Cl$_2$ for an etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using CF$_4$, Cl$_2$, and O$_2$ for an etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. By this second etching treatment, third conductive layers 614*c* and 615*c* are formed. Then, the mask made of resist is removed.

In the second etching treatment described above or in removing the mask made of resist, a thin film including tungsten (W) (a thickness of about 10 nm) is formed. A cross sectional view at this stage is shown in FIG. 5B.

Thereafter, a first doping treatment for doping entirely is conducted using a gate electrode as a mask, in order to add an impurity element imparting an n-type conductivity to a semiconductor layer. An ion doping method or an ion implantation method may be employed to conduct the first doping treatment. The conditions of the ion doping method are a dose amount of 1.5×10$^{13}$ atoms/cm$^2$ and an accelerating voltage of 50 to 100 keV. As the impurity element imparting an n-type conductivity, phosphorus (P) or arsenic (As) is used typically. By this first doping step, doping is conducted through the insulating film 613 and the thin film including tungsten 617 to form a first impurity region (n$^{--}$ region) 618 in a self alignment manner. A cross sectional view at this stage is shown in FIG. 5C. Since the thin film including tungsten is provided, a semiconductor layer overlapped with the first conductive layer 614a is hardly doped with the impurity element imparting an n-type conductivity. In addition, it is also possible that the impurity element imparting an n-type conductivity is prevented from being added to a portion under the first conductive layer 614a by the existence of the thin film including tungsten.

Next, the thin film including tungsten 617 is removed.

Then, after a mask made of resist 619 is formed, a second doping step is conducted to dope the semiconductor with an impurity element imparting an n-type conductivity at a high concentration. A cross sectional view at this stage is shown in FIG. 6A. The mask 619 is provided to protect a channel forming region of the semiconductor layer forming a p-channel TFT of a pixel portion, and a periphery region thereof, and a part of an n-channel TFT in the pixel portion, and a channel forming region of a semiconductor layer forming a p-channel TFT in a driver circuit portion and a periphery region thereof.

Conditions of the ion doping method for the second doping step are a dose amount of $1 \times 10^{13}$ to $5 \times 10^{15}/cm^2$ and an accelerating voltage of 60 to 100 keV. Through this doping step, a second impurity region ($n^+$ region) 620a and a third impurity region ($n^-$ region) 620b are formed. The second impurity region 620a includes a high concentration of an n type impurity which is added through the insulating film 613, and the third impurity region ($n^-$ region) 620b is formed by doping through the first conductive layer 614a and the insulating film 613, and is overlapped with first conductive layer 614a. The n-channel TFT of the pixel portion is partially covered with a mask, and thus, the first impurity region ($n^{--}$ region) 618, which is not overlapped with the first conductive layer 614a, is formed between a channel forming region and the second impurity region 620a. In addition, in the n-channel TFT of the driver circuit portion, doping is made in a self alignment manner, so that a border between the third impurity region 620b overlapping the first conductive layer 614a and the second impurity region 620a is aligned with an end portion of the first conductive layer 614a.

Then, after removing the mask 619, a new mask made of resist 621 is formed, and a third doping step for doping the semiconductor with an impurity element imparting a p-type conductivity (typically boron) at a high concentration is conducted. A cross sectional view at this stage is shown in FIG. 6B. The mask 621 is provided to protect a channel forming region of a semiconductor layer forming an n-channel TFT of the pixel portion, and a periphery region thereof, and a channel forming region of a semiconductor layer forming an n-channel in a driver circuit portion and a periphery region thereof.

The semiconductor layer is doped through the insulating film 613 by the third doping step to form a fourth impurity region ($p^+$ region) 622 including a high concentration of a p-type impurity. In addition, the fourth impurity region 622 is a region ($n^{--}$ region) doped with phosphorus (P) in the first doping step; however, the impurity element imparting a p-type conductivity is added at a concentration of 1.5 to 3 times as much as that of phosphorus (P) and thus, the conductivity is p-type.

After that, the resist mask is removed. Through the above described steps, an impurity region having an n-type or a p-type conductivity is formed in each semiconductor layer. A cross sectional view at this stage is shown in FIG. 6C.

Thereafter, an insulating film including hydrogen 640a is formed by a sputtering method, an LPCVD method, a plasma CVD method or the like, and then, the impurity element added into the semiconductor layer is activated and hydrogenated. As the insulating film including hydrogen 640a, a silicon nitride oxide film (SiNO film) obtained by a PCVD method is used. Here, the thickness of the insulating film including hydrogen 640a is 50 to 200 nm. In addition, gettering for reducing nickel in a channel formation region can also be performed at the same time as activation, when the semiconductor film is crystallized by using a metal element which promotes crystallization, typically, nickel. Note that the insulating film containing hydrogen 640a is a first interlayer insulating film and contains silicon oxide.

Then, an inorganic insulating film 640b to be a second layer of the interlayer insulating film is formed by a sputtering method, an LPCVD method, a plasma CVD method or the like. As the inorganic insulating film 640b, a single layer or a stacked layer of an insulating film such as a silicon oxide film, a silicon nitride film, or a silicon oxynitride film is used. Here, the thickness of the inorganic insulating film 640b is 600 nm to 800 nm.

As one layer of the inorganic insulating film 640b, a siloxane resin obtained by a coating method may be used. The siloxane resin corresponds to a resin including Si—O—Si bond. A skeleton structure of siloxane is formed from a bond of silicon (Si) and oxygen (O). As a substituent, an organic group including at least hydrogen (for example, an alkyl group, or aromatic hydrocarbon) can be used. A fluoro group may also be used as a substituent. Further, an organic group including at least hydrogen and a fluoro group may be used as a substituent.

Then, a mask made of resist is formed using a photomask, and the insulating films 640a and 640b and the insulating film 613 are selectively etched to form contact holes. Then, the mask made of resist is removed.

Then, after a metal film is stacked by a sputtering method, a mask made of resist is formed using a photomask, and the stacked metal film is selectively etched to form electrodes 641 to 647 which serve as a source electrode or a drain electrode of a TFT. The mask made of resist is removed. Here, the stacked metal film has a three-layer structure of a 100-nm-thick Ti film, a 350-nm-thick Al film including a slight amount of Si, and a 100-nm-thick Ti film.

In addition, line widths or positions for the side faces of the electrodes 641 to 647 can be set appropriately such that the side faces thereof are not overlapped with the first conductive layer and the third conductive layer which are provided below.

Through the above mentioned steps, top gate type TFTs 636, 637, 638 and 639 using a polysilicon film as an active layer are manufactured over the same substrate, and a cross sectional view at this stage is shown in FIG. 6D.

The TFT 636 arranged in the driver circuit portion is an n-channel TFT having a low concentration impurity region (also referred to as an LDD region) which is overlapped with a gate electrode, and the TFT 637 is a p-channel TFT. In the driver circuit portion, the TFT 636 and the TFT 637 are connected complementarily to form a CMOS circuit, and various types of circuits can be realized.

In addition, the TFT 638 arranged in the pixel portion is an n-channel TFT having a plurality of channel forming regions in one TFT. The TFT 638 is a multigate type TFT having a low concentration impurity region (also referred to as an LDD region) which is not overlapped with a gate electrode. In addition, in the pixel portion, the TFT 639 is provided, which is electrically connected to a light-emitting element to be formed later. Here, as the TFT 639, a single gate type p-channel TFT is shown; there is no particular limitation, and a multigate type TFT may be used.

Then, a first electrode 623, i.e., an anode (or a cathode) of an organic light-emitting element is formed. As the first electrode 623, a single layer or a stacked layer of a material having a high work function, for example, an element selected from Ni, W, Cr, Pt, Zn, Sn, In or Mo, or an alloy material including such an element as its main component, for example, TN, $TiSi_xN_y$, $WSi_xN_y$, or NbN, may be formed to have a thickness of 100 to 800 nm.

Specifically, as the first electrode 623, a transparent conductive film made of a light-emitting conductive material may be used, for example, indium oxide including tungsten oxide, indium zinc oxide including tungsten oxide, indium oxide including titanium oxide, indium tin oxide including titanium oxide or the like can be used. Needless to say, indium tin oxide (ITO), indium zinc oxide (IZO), indium tin oxide with silicon oxide added (ITSO) or the like can also be used.

Examples of a composition ratio in each light-transmitting conductive material are described. In indium oxide containing tungsten oxide, tungsten oxide may be 1.0 wt % and indium oxide may be 99.0 wt % in its composition ratio. In indium zinc oxide containing tungsten oxide, tungsten oxide may be 1.0 wt %, zinc oxide may be 0.5 wt %, and indium oxide may be 98.5 wt % in its composition ratio. In indium oxide containing titanium oxide, titanium oxide may be 1.0 to 5.0 wt % and indium oxide may be 99.0 to 95.0 wt % in its composition ratio. In indium tin oxide (ITO), tin oxide may be 10.0 wt % and indium oxide may be 90.0 wt % in its composition ratio. In indium zinc oxide (IZO), zinc oxide may be 10.7 wt % and indium oxide may be 89.3 wt % in its composition ratio. Further, in indium tin oxide containing titanium oxide, titanium oxide may be 5.0 wt %, tin oxide may be 10.0 wt %, and indium oxide may be 85.0 wt % in its composition ratio. The composition ratios as described above are just examples, and a composition ratio may be set as is appropriate.

Next, an insulating film obtained by a coating method (for example, SiOx film including an alkyl group or an organic resin film) is patterned to form an insulator 629 (also referred to as a bank, a partition, a barrier, an embankment or the like) covering an end portion of the first electrode 623.

Then, a layer including an organic compound 624 is formed by an evaporation method or a coating method. Next, a second electrode 625, i.e., a cathode (or an anode) of the organic light-emitting element is formed. As the second electrode 625, an alloy such as MgAg, MgIn or AlLi, or a transparent conductive film (such as ITO) is used.

Then, a protective layer 626 is formed by an evaporation method or a sputtering method. The protective layer 626 protects the second electrode 625. When light of the light-emitting element is extracted through the protective layer 626, a transparent material is preferable for the protective layer 626. It is noted that the protective layer 626 may not be provided, if not necessary.

Then, a sealing substrate 633 is attached by a sealant 628 to seal the light-emitting element. In other words, in a light emitting display device, the circumference of a display region is surrounded by the sealant and sealed with a pair of substrates. However, the interlayer insulating film of the TFT is provided over the entire surface of the substrate. Therefore, when a pattern of the sealant is drawn inside a circumference edge of the interlayer insulating film, there is a possibility that moisture or an impurity might enter from a part of the interlayer insulating film which is located outside the pattern of the sealant. Consequently, as for the circumference of the insulating film used as the interlayer insulating film of the TFT the sealant covers inside of the pattern of the sealant, preferably, the edge portion of the insulating film such that it overlaps a pattern of the sealant. Note that a region surrounded by the sealant 628 is filled with a filler 627. Alternatively, the region surrounded by the sealant 628 is filled with a dried inert gas.

Figure 7:
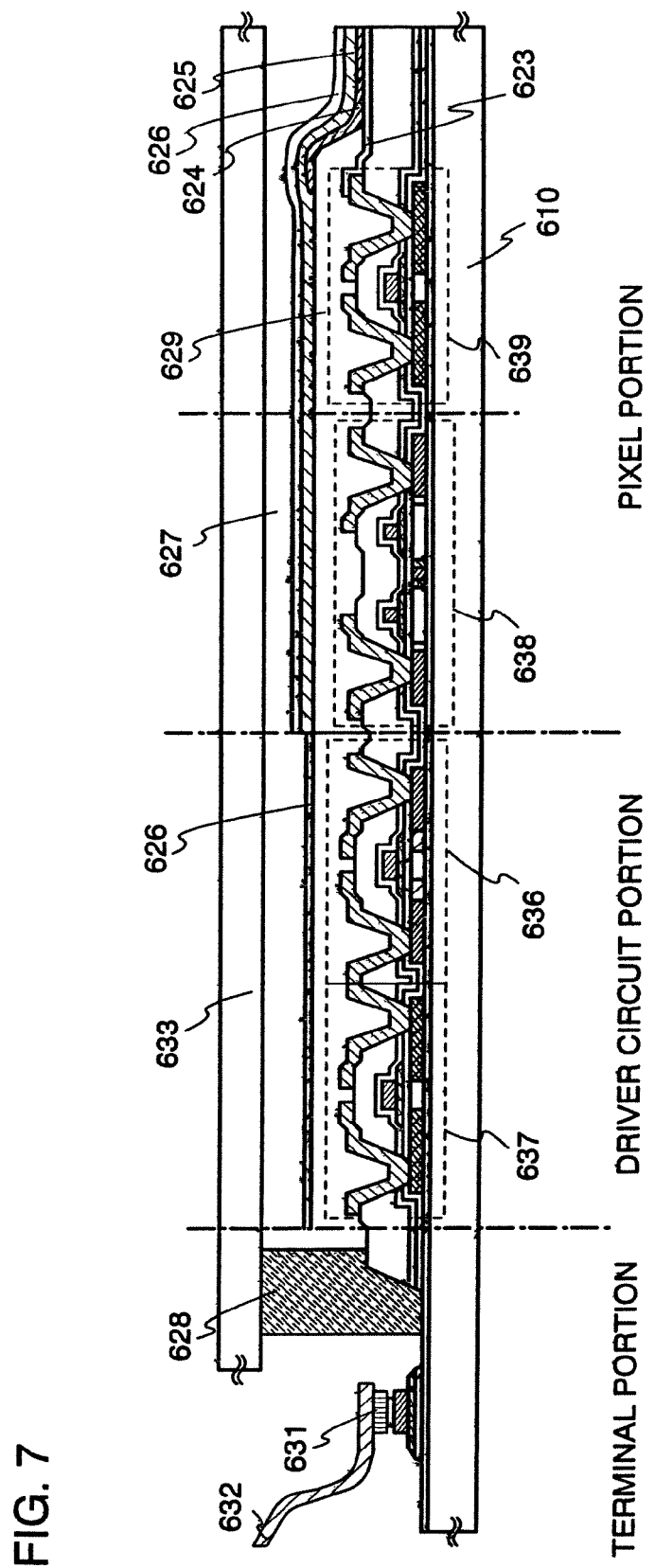
FIG. 7 shows a manufacturing step of a light-emitting device (Embodiment Mode 4)

Lastly, an FPC 632 is attached to a terminal electrode with an anisotropic conductive film 631 by a known method (FIG. 7). A transparent conductive film obtained in the same step as the first electrode 623 is preferably used for a top layer of the terminal electrode and is formed over the third conductive layer 615c to serve as a layer of the terminal electrode formed simultaneously with a gate wiring.

Through the above steps, a pixel portion, a driver circuit, and a terminal portion are formed over one substrate.

In this embodiment mode, line widths or positions are set appropriately such that side faces of the electrodes 641 to 647 are not overlapped with side faces of the first conductive layer and the third conductive layer which are arranged below, and the thickness of the insulator 629 is assured. Therefore, it is possible to prevent the thickness from being partially thinned, and to prevent a short circuit in a portion where the electrodes 641 to 647 and the second electrode 625 are overlapped.

In addition, in the light-emitting device, one surface or both surfaces of the light-emitting device may be used as a light-emitting display surface. In a case that the first electrode 623 and the second electrode 625 are formed using transparent conductive films, light generated in the light-emitting element is extracted on the opposite sides through the substrate 610 and the sealing substrate 633. In this case, transparent materials are preferably used for the sealing substrate 633 or the filler 627.

In addition, in a case that the second electrode 625 is formed with a metal film, and the first electrode 623 is formed with a transparent conductive film, light generated in the light-emitting element is extracted through only the substrate 610, in other words, a bottom emission structure is obtained. In this case, it is not necessary to use a transparent material for the sealing substrate 633 or the filler 627.

When the first electrode 623 is formed with a metal film, and the second electrode 625 is formed with a transparent conductive film, light generated in the light-emitting element is extracted only through the sealing substrate 633, in other words, a top emission structure is obtained. In this case, it is not necessary to use a transparent material for the substrate 610.

Further, the materials for the first electrode 623 and the second electrode 625 need be selected in consideration of a work function. However, the first electrode and the second electrode can each be either an anode or a cathode depending on its pixel structure. When a polarity of a driving TFT is a p-channel type, it is preferable that the first electrode serves as an anode and the second electrode serves as a cathode. When a polarity of the driving TFT is an n-channel type, it is preferable that the first electrode serves as a cathode and the second electrode serves as an anode.

Moreover, in the light-emitting device, a driving method for displaying an image is not limited particularly, and a dot-sequential driving method, a line-sequential driving method, or a frame sequential driving method may be used, for example. The line-sequential driving method is typically employed, and a time division gray scale driving method or an area gray scale driving method may be employed appropriately. In addition, a video signal to be inputted into a source line of the light-emitting device may be an analog signal or a digital signal, and a driver circuit and the like may be designed appropriately according to the video signal.

Further, light-emitting devices using digital video signals are classified into ones in which video signals are inputted into a pixel at a constant voltage (CV), and ones in which video signals are inputted into a pixel at a constant current (CC). The light-emitting devices in which video signals are inputted into a pixel at a constant voltage (CV) are further classified into ones in which a signal is inputted to a light-emitting element at a constant voltage (CVCV), and ones in which a signal is inputted to a light-emitting element at a constant current (CVCC). The light-emitting devices in which video signals are inputted into a pixel at a constant current (CC) are classified into ones in which a constant voltage is applied to a light-emitting element as a signal (CCCV), and ones in which a constant current is applied to a light-emitting element as a signal (CCCC).

Furthermore, a protection circuit (such as a protection diode) may be provided in the light-emitting device so as to prevent electrostatic discharge damage.

This embodiment mode can be freely combined with any one of Embodiment Modes 1 to 3.

Embodiment Mode 5

Figure 8A:
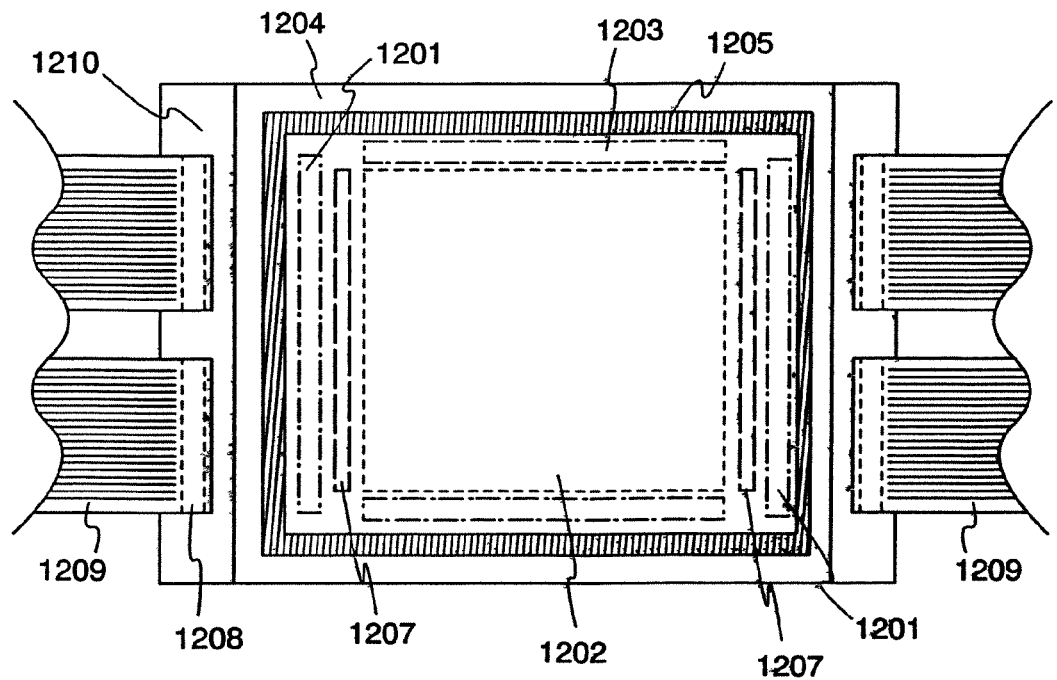
FIGS. 8A and 8B each show a structure of an active matrix type EL display device (Embodiment Mode 5)
Figure 8B:
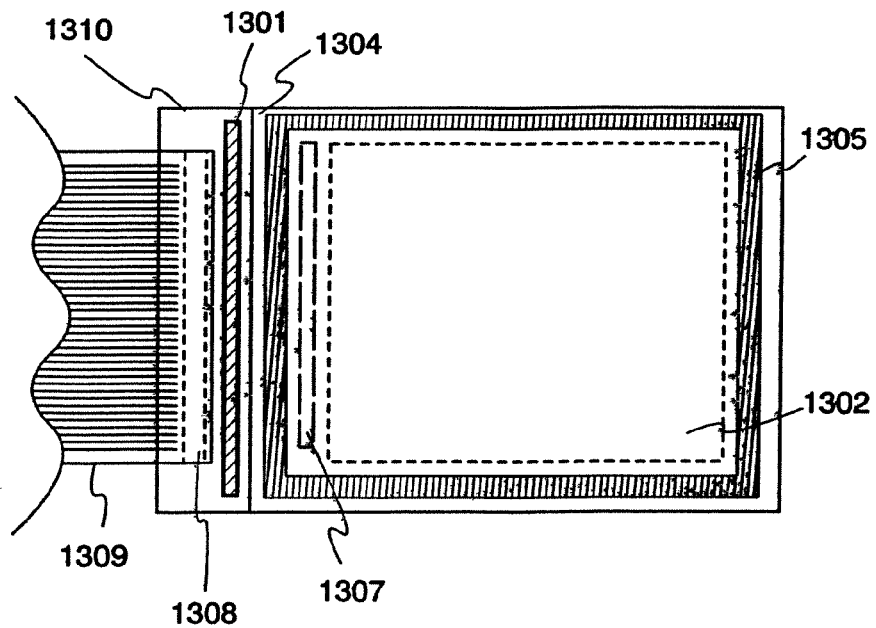

Embodiment Mode 5 describes an example in which an FPC or a driver IC is mounted in a light-emitting display panel with reference to FIGS. 8A and 8B.

FIG. 8A is a top view of a light-emitting device in which FPCs 1209 are attached to four terminal portions 1208, as an example. A pixel portion 1202 including a light-emitting element and a TFT, a gate side driver circuit 1203 including a TFT, and a source side driver circuit 1201 including a TFT are formed over a substrate 1210. These circuits can be formed over one substrate when active layers of TFTs each are formed from a semiconductor film having a crystalline structure. Therefore, an EL display panel in which the system-on-panel is realized can be manufactured.

Note that the portion of the substrate 1210 other than a contact portion is covered with a protective film, and a base layer containing a photocatalytic substance is provided over the protective film.

Two connecting regions 1207 provided so as to sandwich the pixel portion are provided for contacting a second electrode of a light-emitting element to a lower wiring. Note that a first electrode of the light-emitting element is electrically connected to a TFT provided in the pixel portion.

A sealing substrate 1204 is fixed to the substrate 1210 by a sealant 1205 surrounding the pixel portion and the driver circuits and by a filler surrounded with the sealant. In addition, a structure in which a filler including a transparent drying agent is used may also be employed. A drying agent may be disposed in a region which is not overlapped with the pixel portion.

The structure shown in FIG. 8A is a preferred example of a light-emitting device of a relatively large size of XGA class (for example, the opposite angle: 4.3 inches). FIG. 9B is an example of employing a COG mode which is suitable for a small size light-emitting device whose frame is narrowed (for example, the opposite angle: 1.5 inches).

In FIG. 8B, a driver IC 1301 is mounted on a substrate 1310 and an FPC 1309 is mounted on a terminal portion 1308 disposed at the end of the driver IC. A plurality of the driver ICs 1301 to be mounted are preferably formed over a rectangular substrate to be 300 to 1000 mm or more on one side, from the view point of improving the productivity. In other words, a plurality of circuit patterns having a driver circuit portion and an input-output terminal as a unit are preferably formed over a substrate and separated to take driver ICs. The driver IC may be formed to be rectangular with a longer side of 15 to 80 mm and a shorter side of 1 to 6 mm. Alternatively, the driver IC may have a side with a length corresponding to one side of a pixel region or a length in which one side of a driving circuit is added to one side of the pixel portion.

The driver IC is superior to an IC chip in terms of external size, since it has a longer side. When a driver IC formed to be 15 to 80 mm on a longer side is used, the number of driver ICs to be required for being mounted corresponding to the pixel portion is small, as compared with the case of using IC chips, thereby improving the yield in manufacturing. When a driver IC is formed over a glass substrate, the productivity is not lost because there is no limitation on the shape of a mother substrate. This is a great advantage, as compared with the case of taking out an IC chip from a circular silicon wafer.

In addition, a TAB mode may be employed, and in that case, a plurality of tapes are attached and a driver IC may be mounted on the tapes. As in the case of the COG mode, a single driver IC may be mounted on a single tape. In this case, a metal piece or the like for fixing a driver IC is preferably attached therewith in order to enhance the intensity.

A connecting region 1307 provided between a pixel portion 1302 and the driving IC 1301 is provided for contacting a second electrode of a light-emitting element to a lower wiring. Note that the first electrode of the light-emitting element is electrically connected to a TFT provided for the pixel portion.

A sealing substrate 1304 is fixed on the substrate 1310 by a sealant 1305 surrounding the pixel portion 1302 and by a filler surrounded with the sealant.

When using an amorphous semiconductor film as an active layer of a TFT in the pixel portion, it is difficult to form a driver circuit over the same substrate, and thus, the structure shown in FIG. 8B is employed even when it has a large size.

The active matrix light emitting device is shown as an example of a display device here, and it is natural that the present invention can be applied to an active matrix liquid crystal display device. In the active matrix liquid crystal display device, pixel electrodes arranged in matrix are driven to display an image pattern on the screen. Specifically, a voltage is applied between a selected pixel electrode and an opposite electrode corresponding to the pixel electrode, and thus, a liquid crystal between the pixel electrode provided in the element substrate and the opposite electrode provided in the opposite substrate is modulated optically. The optical modulation can be recognized as an image pattern by an observer. The opposite substrate and the element substrate are disposed at an even interval apart and the space therebetween is filled with a liquid crystal. The liquid crystal material may be dropped under reduced pressure so that a bubble does not enter by the sealant having a closed pattern, and the substrates may be pasted onto each other. Alternatively, a dip method (pumping method) may be employed in which the liquid crystal is injected using a capillary phenomenon after providing a seal pattern having an opening portion and pasting the TFT substrate.

In addition, the present invention can be applied to a liquid crystal display device with an optical shutter and a field sequential driving system of blinking a backlight light source for three colors of RGB at high speed, without a color filter.

As described above, by implementing the present invention, in other words, by using any structure or manufacturing method of Embodiment Modes 1 to 4, various electronic devices can be completed.

Embodiment Mode 6

As semiconductor devices and electronic devices according to the present invention, cameras such as video cameras or digital cameras, goggle-type displays (head mounted displays), navigation systems, audio reproduction devices (such as car audio components, or audio components), personal computers such as laptop personal computers, game machines, mobile information terminals (mobile computers, cellular phones, mobile game machines, electronic books, and the like), image reproduction devices provided with a recording medium (specifically, devices which can reproduce content of a recording medium such as Digital Versatile Disk (DVD) and have a display for displaying the image), and the like can be given. Specific examples of the electronic devices are shown in FIGS. 9A to 9D and FIG. 10.

Figure 9A:
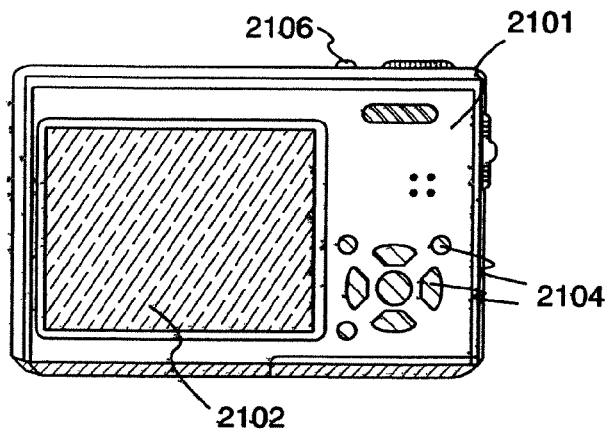
FIGS. 9A to 9D each show one example of an electronic device (Embodiment Mode 6)
Figure 9B:
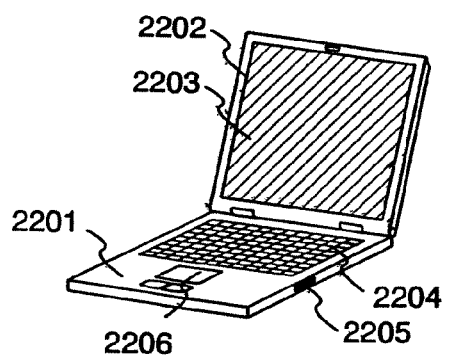

FIG. 9A shows a digital camera, which includes a main body 2101, a display portion 2102, an imaging portion, operation keys 2104, a shutter 2106 and the like. FIG. 9A shows the digital camera seen from the display portion 2102 side, and the imaging portion is not shown in FIG. 9A. In accordance with the present invention, a highly reliable digital camera can be manufactured.

FIG. 9B shows a laptop personal computer including a main body 2201, a casing 2202, a display portion 2203, a keyboard 2204, an external connection port 2205, a pointing mouse 2206, and the like. In accordance with the present invention, a highly reliable laptop personal compute can be manufactured.

Figure 9C:
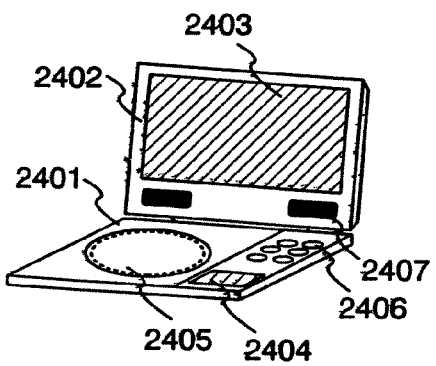

FIG. 9C shows a portable image reproducing device provided with a recording medium (specifically a DVD player), which includes a main body 2401, a casing 2402, a display portion A 2403, a display portion B 2404, a recording medium (such as a DVD) reading portion 2405, operation keys 2406, a speaker portion 2407 and the like. The display portion A 2403 mainly displays image information and the display portion B 2404 mainly displays character information. The category of such an image reproducing device provided with a recording medium includes a home game machine and so on. In accordance with the present invention, a highly reliable image reproducing device can be manufactured.

Figure 9D:
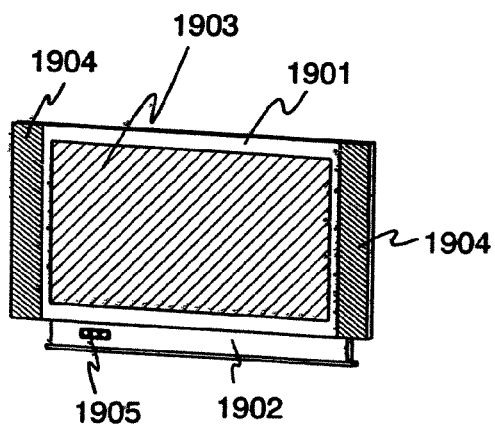

FIG. 9D shows a display device which includes a casing 1901, a support 1902, a display portion 1903, a speaker portion 1904, a video input terminal 1905 and the like. This display device is manufactured by using a thin film transistor formed by a manufacturing method described in Embodiment Modes described above for the display portion 1903 and a driver circuit. Liquid crystal display devices, light-emitting devices and the like are given as examples of display devices. Specifically, all types of display devices for displaying information are included, for example, display devices for computers, display devices for receiving television broadcasting, and display devices for advertisement. In accordance with the present invention, a highly reliable display device, in particular, a large size display device having a large screen of 22 to 50 inches, can be manufactured.

Figure 10:
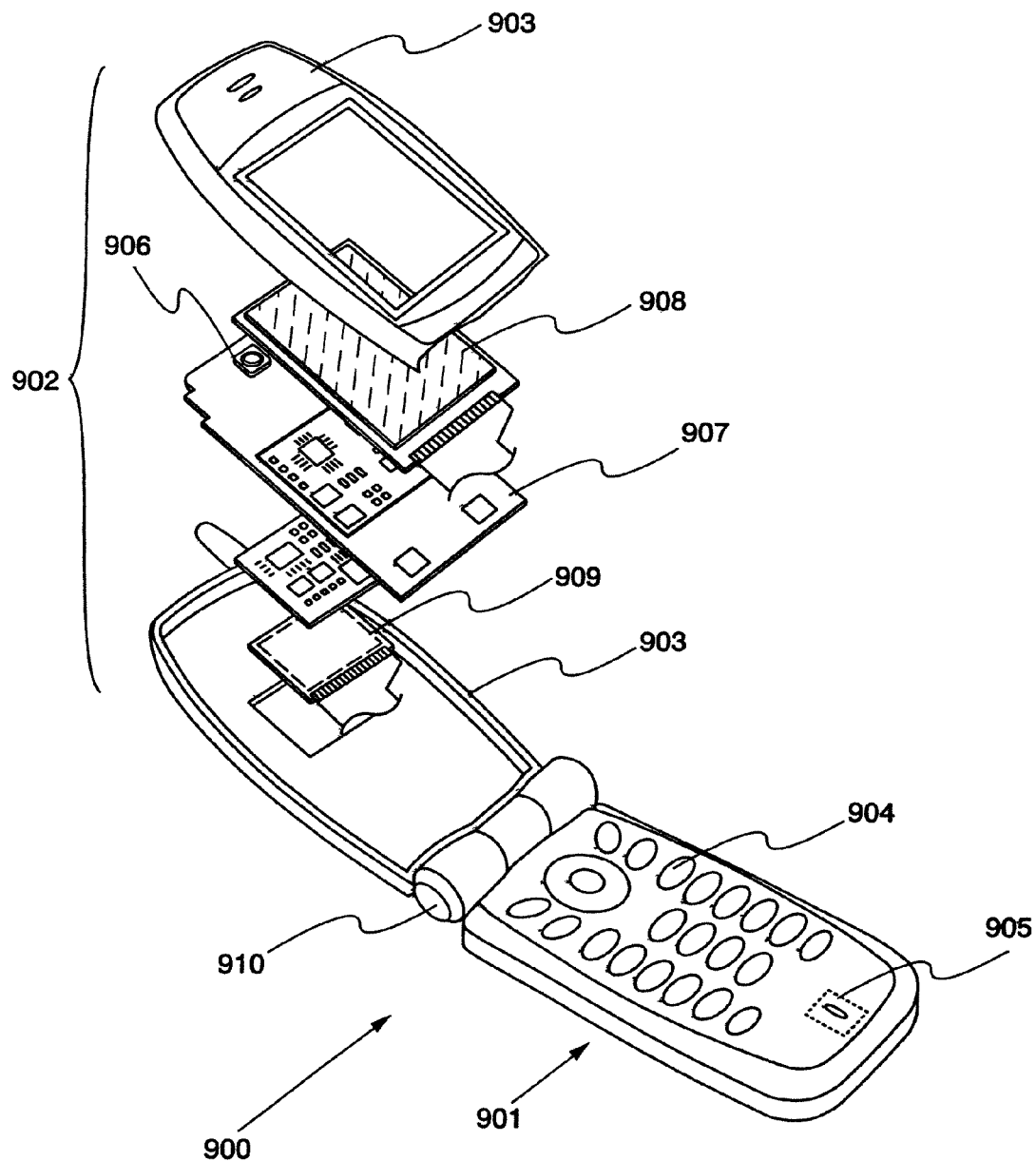
FIG. 10 shows an example of an electronic device (Embodiment Mode 6)

In the cellular phone shown in FIG. 10, a main body (A) 901 including operation switches 904, a microphone 905, and the like is connected with a hinge 910 to a main body (B) 902 including a display panel (A) 908, a display panel (B) 909, a speaker 906, and the like, and it is openable and closable by the hinge 910. The display panel (A) 908 and the display panel (B) 909 are placed in a casing 903 of the main body (B) 902 together with a circuit board 907. Pixel portions of the display panel (A) 908 and the display panel (B) 909 are placed such that they are visible through an opening formed in the casing 903.

As for the display panel (A) 908 and the display panel (B) 909, the specifications such as the number of pixels can be appropriately determined in accordance with the functions of the cellular phone 900. For example the display panel (A) 908 and the display panel (B) 909 can be combined as a main screen and a sub-screen, respectively.

In accordance with the present invention, a highly reliable mobile information terminal can be realized.

The cellular phone according to this embodiment mode can be changed in various modes depending on functions or applications thereof. For example, it may be a camera-equipped cellular phone by implementing an imaging element in the hinge 910. Even when the operation switches 904, the display panel (A) 908, and the display panel (B) 909 are placed in one casing, the above-described effect can be obtained. Further, a similar effect can be obtained even when the structure of this embodiment mode is applied to an information display terminal equipped with a plurality of display portions.

As described above, various types of electronic devices can be completed by implementing the present invention, in other words, by using any one manufacturing method or structure of Embodiment Modes 1 to 5.

The present invention is effective, since a short circuit in manufacturing or after manufacturing a semiconductor device can be effectively prevented.

The present application is based on Japanese Patent Application serial No. 2005-141132 filed on May 13, 2005 in Japanese Patent Office, the entire contents of which are hereby incorporated by reference.

What is claimed is:

1. A semiconductor device comprising:
    a substrate;
    a first wiring over the substrate;
    a first insulating film over the first wiring:
    a second wiring over the first insulating film;
    a conductive layer over and in direct contact with the first insulating film, wherein the conductive layer comprises the same material as the second wiring;
    a second insulating film over the conductive layer; and
    a thin film transistor over the substrate, wherein the thin film transistor comprises a semiconductor layer and a portion of the first wiring,
    wherein the conductive layer has a first region and a second region, wherein the first region overlaps with the first wiring and the second region does not overlap with the first wiring, and
    wherein the conductive layer is electrically insulated from other wirings.

2. The semiconductor device according to claim 1, wherein the second wiring comprises a multi-layered film including a first metal layer and a second metal layer.

3. The semiconductor device according to claim 1, wherein an edge portion of each of the first wiring, the second wiring and the conductive layer has a tapered shape.

4. The semiconductor device according to claim 1, wherein the conductive layer does not overlap with the semiconductor layer.

5. The semiconductor device according to claim 1, wherein a thickness of the conductive layer is larger than that of a part of the second insulating film overlapping the conductive layer.

6. The semiconductor device according to claim 1, wherein the second insulating film over the first region and the second insulating film over the second region have substantially same thickness.

7. The semiconductor device according to claim 1, the semiconductor device further comprising a pixel electrode electrically connected to the thin film transistor.

8. The semiconductor device according to claim 1, wherein the thin film transistor comprises a part of the first wiring as a gate electrode, a part of the first insulating film as a gate insulating layer, and a part of the second wiring as a source electrode.

9. A display device comprising the semiconductor device according to claim 1.

10. A semiconductor device comprising:
a substrate;
a first wiring over the substrate;
a first insulating film over the first wiring;
a second wiring over the first insulating film;
a conductive layer over and in direct contact with the first insulating film, wherein the conductive layer comprises the same material as the second wiring;
a pixel electrode;
a second insulating film over the conductive layer; and
a thin film transistor over the substrate, wherein the thin film transistor comprises a semiconductor layer and is electrically connected to the pixel electrode,
wherein the conductive layer has a first region and a second region, wherein the first region overlaps with the first wiring and the second region does not overlap with the first wiring,
wherein the conductive layer is electrically insulated from other wirings, and
wherein a part of an edge portion of the conductive layer is parallel to a part of an edge portion of the pixel electrode.

11. The semiconductor device according to claim 10, wherein the second wiring comprises a multi-layered film including a first metal layer and a second metal layer.

12. The semiconductor device according to claim 10, wherein an edge portion of each of the first wiring, the second wiring and the conductive layer has a tapered shape.

13. The semiconductor device according to claim 10, wherein the conductive layer does not overlap with the semiconductor layer.

14. The semiconductor device according to claim 10, wherein a thickness of the conductive layer is larger than that of a part of the second insulating film overlapping the conductive layer.

15. The semiconductor device according to claim 10, wherein the second insulating film over the first region and the second insulating film over the second region have substantially same thickness.

16. The semiconductor device according to claim 10, wherein the pixel electrode is electrically connected to the thin film transistor.

17. The semiconductor device according to claim 10, wherein the thin film transistor comprises a part of the first wiring as a gate electrode, a part of the first insulating film as a gate insulating layer, and a part of the second wiring as a source electrode.

18. A display device comprising the semiconductor device according to claim 10.

19. A semiconductor device comprising:
a substrate;
a first wiring over the substrate;
a first insulating film over the first wiring;
a second wiring over the first insulating film;
a conductive layer over and in direct contact with the first insulating film, wherein the conductive layer comprises the same material as the second wiring;
a second insulating film over the conductive layer; and
a thin film transistor over the substrate, wherein the thin film transistor comprises a semiconductor layer and a portion of the first wiring,
wherein the conductive layer is electrically insulated from other wirings, and wherein the conductive layer extends beyond an edge portion of the first wiring.

20. The semiconductor device according to claim 19, wherein the second wiring comprises a multi-layered film including a first metal layer and a second metal layer.

21. The semiconductor device according to claim 19, wherein an edge portion of each of the first wiring, the second wiring and the conductive layer has a tapered shape.

22. The semiconductor device according to claim 19, wherein the conductive layer does not overlap with the semiconductor layer.

23. The semiconductor device according to claim 19, wherein a thickness of the conductive layer is larger than that of a part of the second insulating film overlapping the conductive layer.

24. The semiconductor device according to claim 19, the semiconductor device further comprising a pixel electrode electrically connected to the thin film transistor.

25. The semiconductor device according to claim 19, wherein the thin film transistor comprises a part of the first wiring as a gate electrode, a part of the first insulating film as a gate insulating layer, and a part of the second wiring as a source electrode.

26. A display device comprising the semiconductor device according to claim 19.

27. A semiconductor device comprising:
a substrate;
a first wiring over the substrate;
a first insulating film over the first wiring;
a second wiring over the first insulating film;
a conductive layer over and in direct contact with the first insulating film, wherein the conductive layer comprises the same material as the second wiring;
a pixel electrode;
a second insulating film over the conductive layer; and
a thin film transistor comprising a portion of the first wiring over the substrate, wherein the thin film transistor comprises a semiconductor layer and is electrically connected to the pixel electrode,
wherein the conductive layer extends beyond an edge portion of the first wiring,
wherein the conductive layer is electrically insulated from other wirings, and
wherein a part of an edge portion of the conductive layer is parallel to a part of an edge portion of the pixel electrode.

28. The semiconductor device according to claim 27, wherein the second wiring comprises a multi-layered film including a first metal layer and a second metal layer.

29. The semiconductor device according to claim 27, wherein an edge portion of each of the first wiring, the second wiring and the conductive layer has a tapered shape.

30. The semiconductor device according to claim 27, wherein the conductive layer does not overlap with the semiconductor layer.

31. The semiconductor device according to claim 27, wherein a thickness of the conductive layer is larger than that of a part of the second insulating film overlapping the conductive layer.

32. The semiconductor device according to claim 27, wherein the pixel electrode is electrically connected to the thin film transistor.

33. The semiconductor device according to claim 27, wherein the thin film transistor comprises a part of the first wiring as a gate electrode, a part of the first insulating film as a gate insulating layer, and a part of the second wiring as a source electrode.

34. A display device comprising the semiconductor device according to claim 27.

\* \* \* \* \*

UNITED STATES PATENT AND TRADEMARK OFFICE
CERTIFICATE OF CORRECTION

PATENT NO. : 8,878,262 B2  
APPLICATION NO. : 13/444565  
DATED : November 4, 2014  
INVENTOR(S) : Masayuki Sakakura et al.

Page 1 of 1

It is certified that error appears in the above-identified patent and that said Letters Patent is hereby corrected as shown below:

In the Specification:

Column 11, line 48, "n-channel in" should read --n-channel TFT in--.

Column 13, line 6, "TN," should read --TiN,--.

Column 13, lines 7, "TiSi$_x$N$_y$, WSi$_x$N$_y$, or NbN," should read --TiSi$_x$N$_y$, WSi$_x$, WN$_x$, WSi$_x$N$_y$, or NbN,--.

Signed and Sealed this  
Fourteenth Day of April, 2015

Michelle K. Lee  
*Director of the United States Patent and Trademark Office*